(12) United States Patent
Fathololoumi et al.

(10) Patent No.: US 10,942,315 B2
(45) Date of Patent: *Mar. 9, 2021

(54) REDUCING BACK REFLECTION IN A PHOTODIODE

(71) Applicant: Elenion Technologies, LLC, New York, NY (US)

(72) Inventors: Saeed Fathololoumi, San Gabriel, CA (US); Yang Liu, Elmhurst, NY (US); Yaojia Chen, Jersey City, NJ (US)

(73) Assignee: Elenion Technologies, LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/530,179

(22) Filed: Aug. 2, 2019

(65) Prior Publication Data

US 2019/0353845 A1 Nov. 21, 2019

Related U.S. Application Data

(63) Continuation of application No. 15/864,714, filed on Jan. 8, 2018, now Pat. No. 10,409,005.

(51) Int. Cl.
*H01L 31/18* (2006.01)
*G02B 6/32* (2006.01)
*G02B 6/12* (2006.01)
*H01L 31/0232* (2014.01)
*G02B 6/42* (2006.01)

(52) U.S. Cl.
CPC ............. *G02B 6/327* (2013.01); *G02B 6/12* (2013.01); *G02B 6/12004* (2013.01); *G02B 6/4207* (2013.01); *H01L 31/02327* (2013.01); *H01L 31/18* (2013.01); *G02B 2006/12061* (2013.01); *G02B 2006/12123* (2013.01); *G02B 2006/12126* (2013.01); *G02B 2006/12176* (2013.01)

(58) Field of Classification Search
CPC ...... G02B 6/327; G02B 6/12; G02B 6/12004; G02B 6/4207; G02B 2006/12061; G02B 2006/12123; G02B 2006/12126; G02B 2006/12176; H01L 31/02327; H01L 31/18
See application file for complete search history.

(56) References Cited

U.S. PATENT DOCUMENTS

| | | | | |
|---|---|---|---|---|
| 8,900,899 B2* | 12/2014 | Rabiei | ...................... | G02B 6/13 257/382 |
| 2008/0112677 A1* | 5/2008 | Smith | ...................... | G02B 6/06 385/119 |
| 2010/0135615 A1* | 6/2010 | Ho | ...................... | G02B 6/0281 385/33 |
| 2014/0063853 A1* | 3/2014 | Nichol | ................. | G02B 6/0028 362/616 |
| 2015/0016775 A1* | 1/2015 | Ho | ........................ | G02B 6/32 385/33 |

* cited by examiner

*Primary Examiner* — Fernando L Toledo
*Assistant Examiner* — Valerie N Newton
(74) *Attorney, Agent, or Firm* — Stratford Managers Corporation

(57) ABSTRACT

The back reflection in photodiodes is caused by an abrupt index contrast between the input waveguide and the composite waveguide/light absorbing material. In order to improve the back reflection, it is proposed to introduce an angle between the waveguide and the leading edge of the light absorbing material. The angle will result in gradually changing the effective index between the index of the waveguide and the index of the composite section, and consequently lower the amount of light reflecting back.

11 Claims, 15 Drawing Sheets

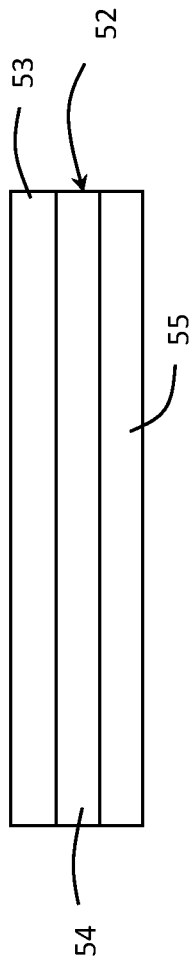
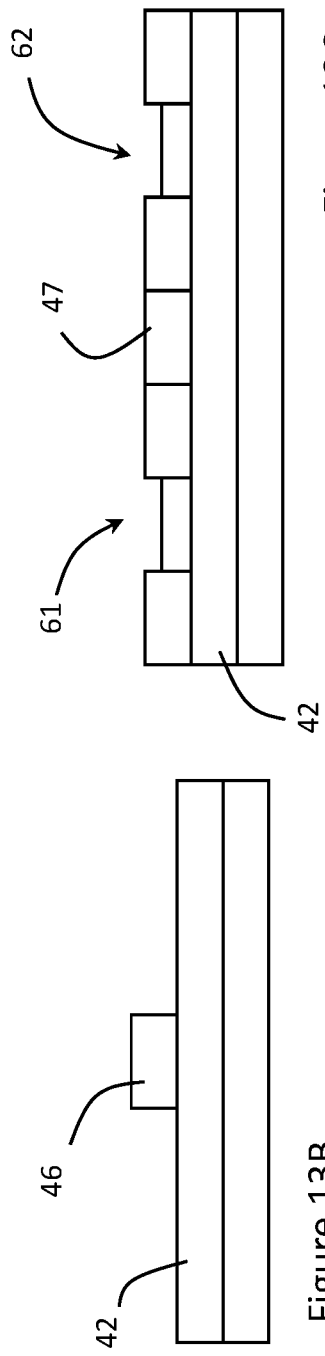
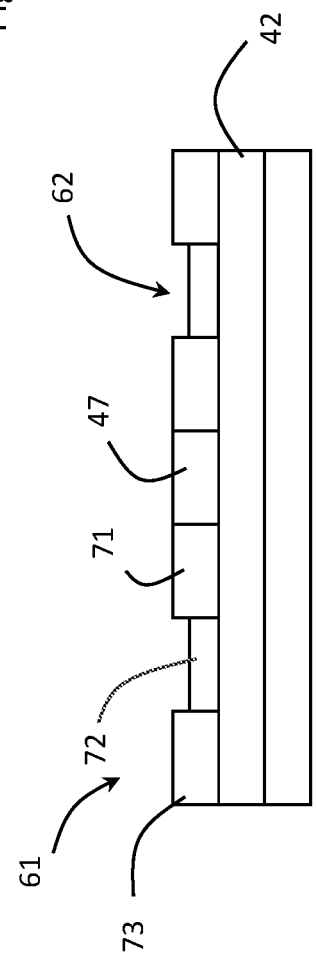

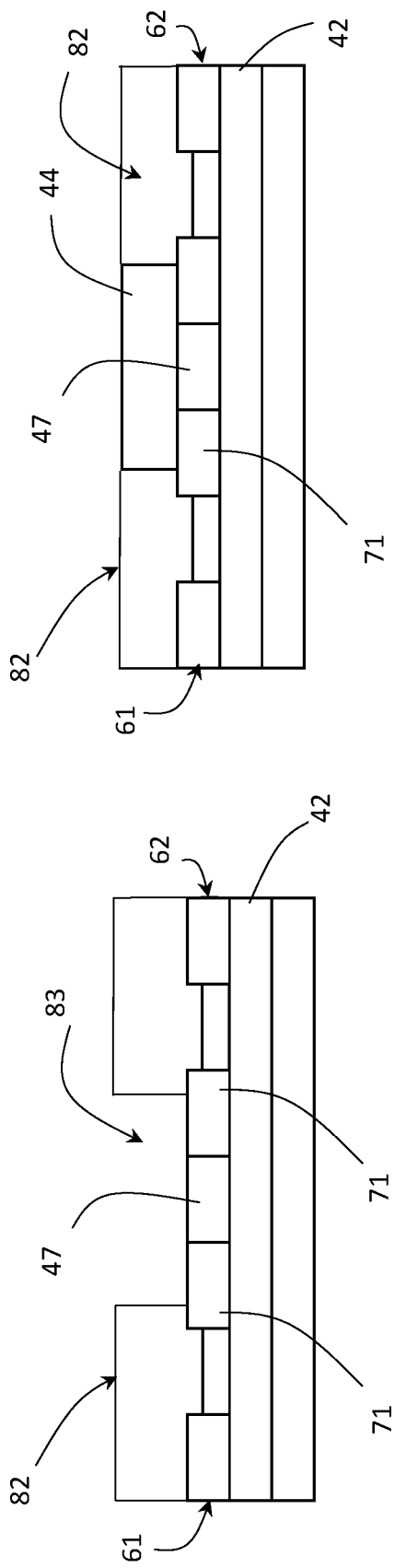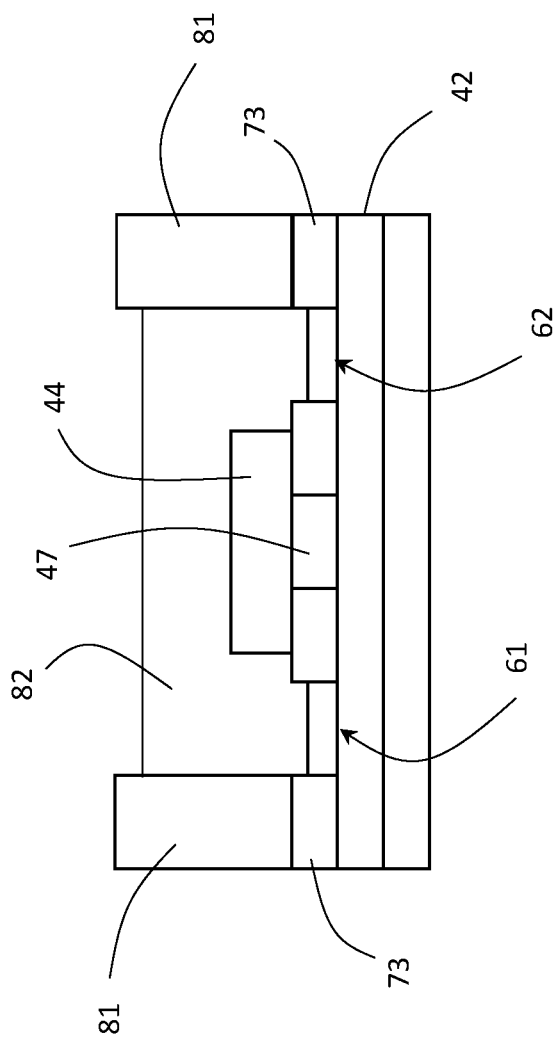

REDUCING BACK REFLECTION IN A PHOTODIODE

CROSS-REFERENCE TO RELATED APPLICATIONS

This application is a continuation of and claims priority to U.S. patent application Ser. No. 15/754,105, filed Jan. 8, 2018, now allowed, which is hereby incorporated by reference herein in its entirety.

TECHNICAL FIELD

The present invention relates to reducing back reflection in photodetectors, and in particular to reducing back reflection in a semiconductor photo-diode.

BACKGROUND

The demand for increased speeds and reduced costs in communication systems keeps growing, due in large part to the increase in mobile device usage, streaming media services, cloud computing, and big data analysis. Semiconductor waveguide, e.g. silicon, photonics has become the most promising technology to provide high-speed, low energy consumption and low cost next-generation data communication systems.

Active devices, including photodetectors (PD), are a critical part of photonics integrated circuits (PIC), particularly for semiconductor waveguide, e.g. silicon, photonics (SiPh). A photodetector with high responsivity will compensate the channel insertion loss, and help fulfill the required link power budget. Several semiconductor absorbing materials, e.g. indium gallium arsenide (InGaAs), gallium phosphide (GaP), Silicon (Si) and Germanium (Ge), may be used, but Germanium, which may be epitaxially grown on Silicon, is the preferred absorber material, due to its compatibility with complementary metal oxide semiconductor (CMOS) fabrication processes. An example of a semiconductor photodiode is disclosed in U.S. Pat. No. 9,553,222, issued Jan. 24, 2017, which is incorporated herein by reference.

However due to sensitivity of PICs to back reflection, it is important to design photodiode elements with low back reflection. Currently back reflection of slightly lower than −30 dB has been demonstrated. Back reflection of individual PIC components becomes a large bottleneck for scaling PIC devices for higher performance applications. It is important to lower back reflection of individual component, particularly for active elements, without compromising the device performance. In a conventional photodetector 1, illustrated in FIGS. 1 and 2, a semiconductor waveguide, e.g. silicon, 2 is mounted on a substrate 3 by any conventional manner, e.g. SOI, with a slab of light absorbing material 4, e.g. germanium, deposited thereon. For the PD device 1 the introduction of the absorbing material 4, causes the effective index of the optical mode 5 to experience abrupt change that may result in part of the light reflecting back.

An object of the present invention is to overcome the shortcomings of the prior art by providing a semiconductor photodetector with reduced back reflection.

SUMMARY OF THE INVENTION

Accordingly, the present invention relates to a photodetector device comprising:
a substrate;
a waveguide extending on the substrate, including an index of refraction, and an input section including an optical axis for transmitting an optical signal along the optical axis;
a light-absorber material for generating electrical signals by absorbing the optical signal, the light-absorber material disposed adjacent to a section of the waveguide forming a composite section therewith, with an effective combined index of refraction;
wherein a leading edge of the light absorber material is at a first acute angle to the optical axis of the input section of the waveguide ensuring a more gradual change in the effective index of refraction between the index of refraction of the waveguide and the combined index of refraction of composite section.

Another aspect of the present invention relates to a method of manufacturing a photodetector device comprising:
a) providing a wafer including a substrate and a device layer;
b) patterning and etching the device layer forming a waveguide including an index of refraction, and an input section, including an optical axis along which an optical signal is transmitted; and
c) depositing a light absorbing material adjacent to a section of the waveguide forming a composite section therewith, with an effective combined index of refraction;
wherein a leading edge of the light absorber material is at a first acute angle to the optical axis of the input section of the waveguide ensuring a more gradual change in the effective index of refraction between the index of refraction of the waveguide and the effective combined index of refraction of the composite section.

BRIEF DESCRIPTION OF THE DRAWINGS

The invention will be described in greater detail with reference to the accompanying drawings which represent preferred embodiments thereof, wherein:
FIGS. 13A to 13G illustrate a method of fabricating the devices of FIGS. 3 to 12.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
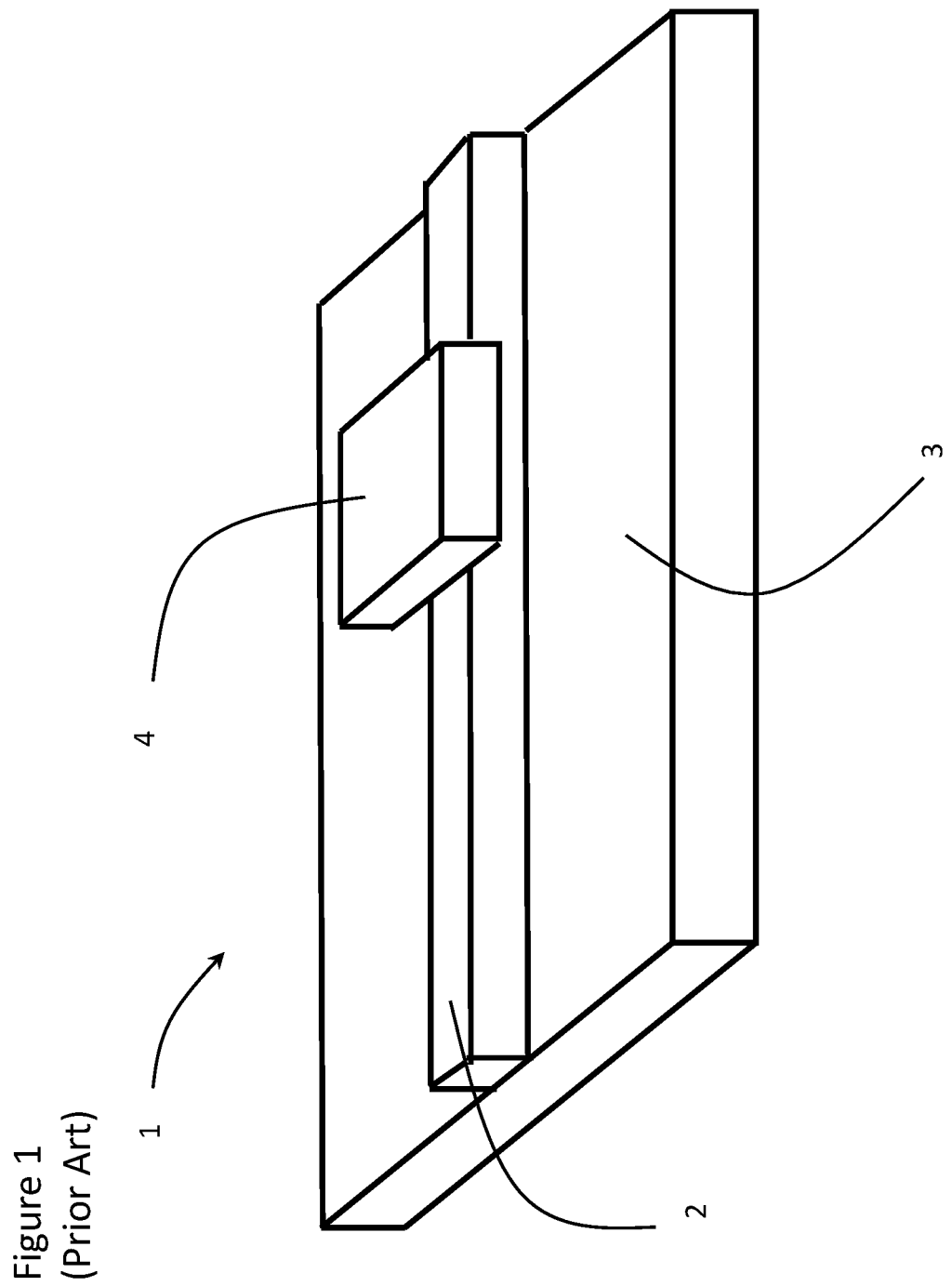
FIG. 1 is an isometric view of a conventional photodiode.
Figure 2:
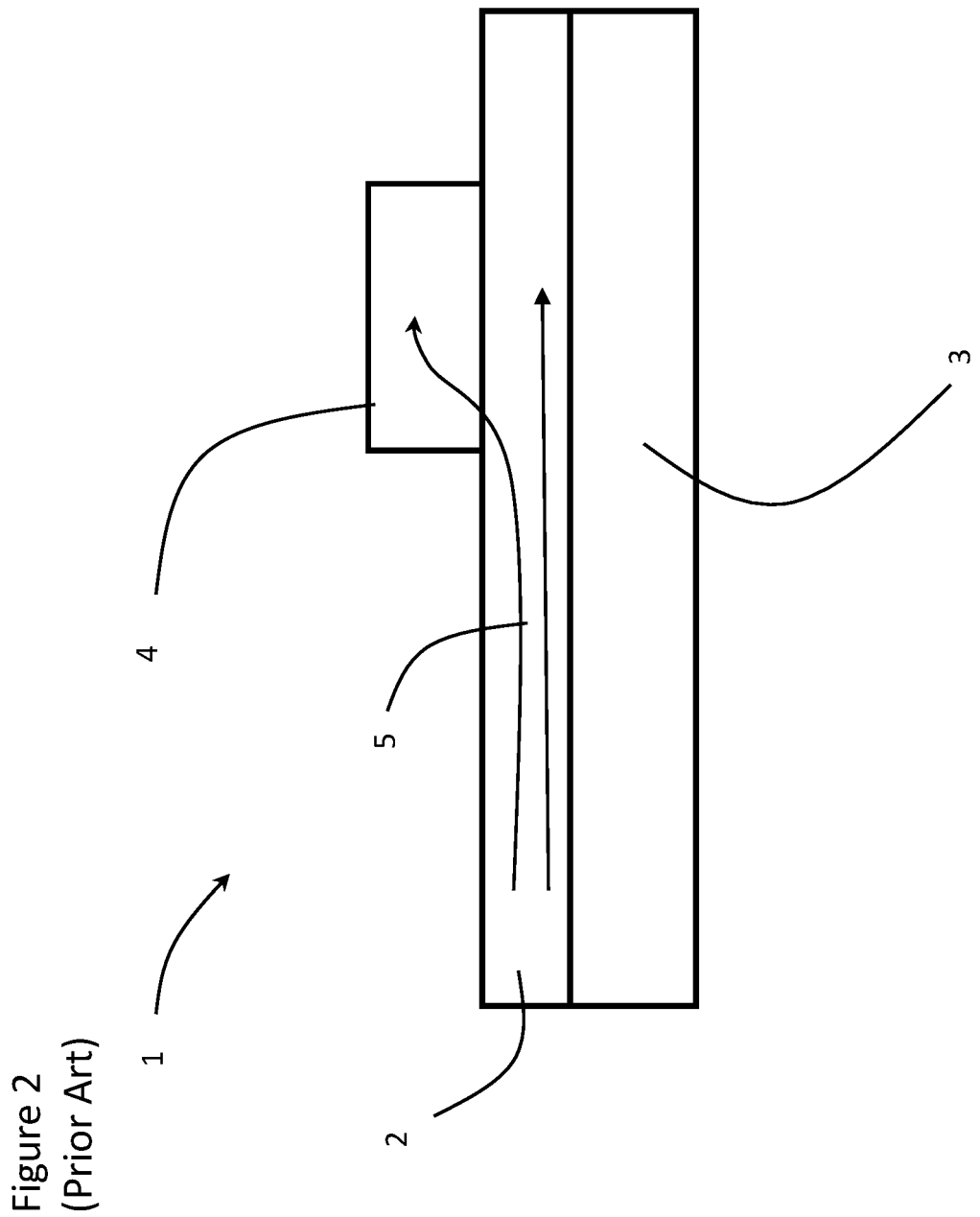
FIG. 2 is a side view of the conventional photodiode of FIG. 1.
Figure 3:
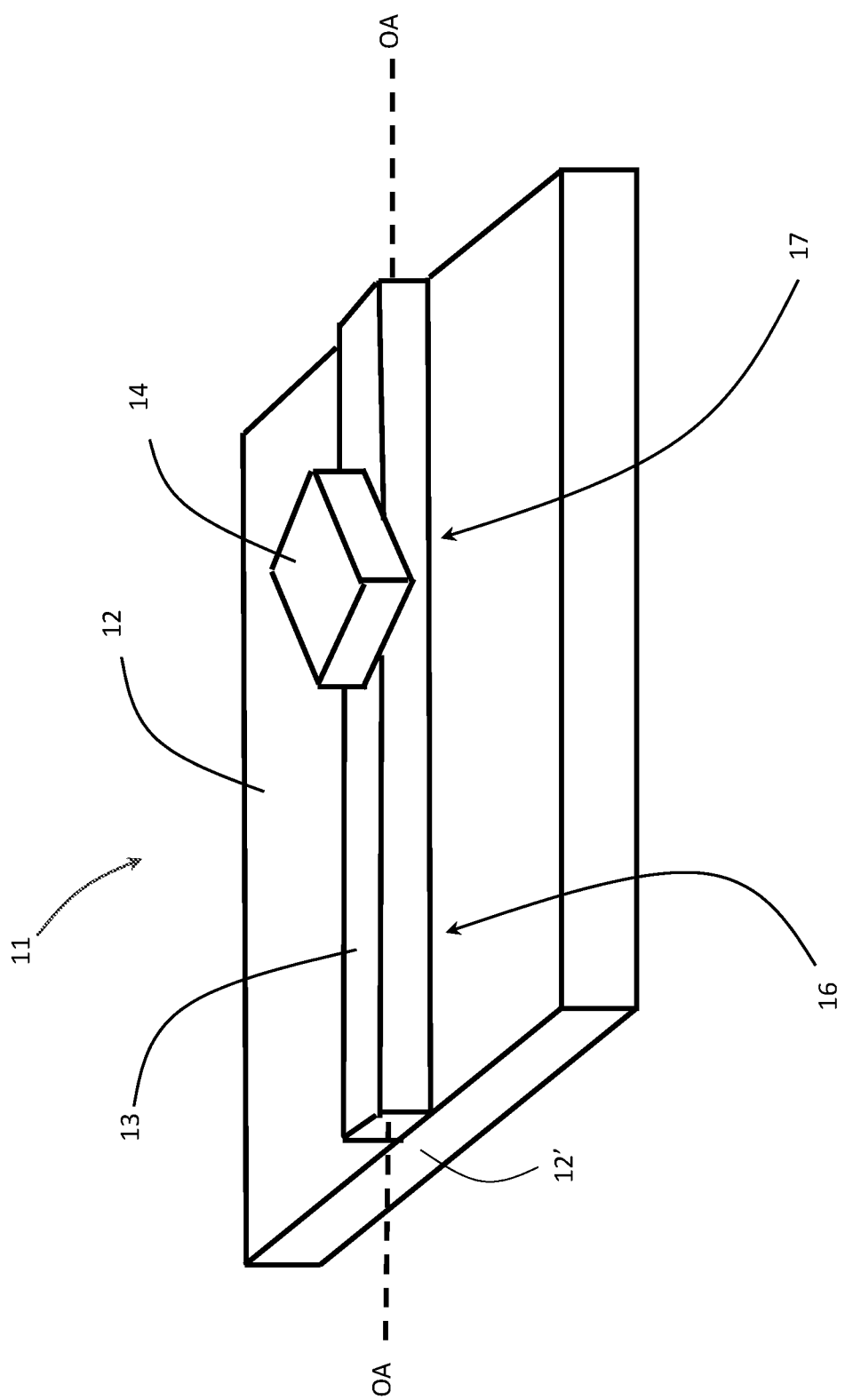
FIG. 3 is an isometric view in accordance with an embodiment of the present invention.

With reference to FIGS. 3 and 4, a photodetector, e.g. photodiode 11, of an exemplary embodiment of the present invention includes a substrate 12, on which is provided a waveguide 13, e.g. silicon, for transmitting an optical signal, typically a single mode optical signal. A cladding material, e.g. $SiO_2$, (not shown) is typically provided surrounding the waveguide 13, with a lower index of refraction than the waveguide material, to contain the optical signal within the waveguide 13. A slab of light absorbing material 14, e.g. germanium, is provided adjacent to the waveguide 13 enabling the optical signal travelling in the waveguide 13 to be absorbed therein. Several other semiconductor absorbing materials, e.g. indium gallium arsenide (InGaAs), gallium phosphide (GaP) and Silicon (Si) may be used, but Germanium, which may be epitaxially grown on Silicon, is the preferred absorber material 14. The light absorbing material 14 is connected to suitable electrical contacts and terminals, as is well known in the art, for transmitting electrical signals generated therein to external components. Ideally, the light absorbing material 14 is epitaxial grown on contact or some other base material, e.g. a doped semiconductor, like Si, or dielectric material, with the crystal orientation of the light absorbing material following that of the contact or base material that is underneath. The waveguide 13 is comprised of an input section 16, with an optical axis OA, and a composite section 17 adjacent to, e.g. beneath, the light absorbing material 14. The input section 16 of the waveguide 13 may extend longitudinally across the substrate 12 with the optical axis OA perpendicular to an input edge 12' of the substrate 12.

The substrate 12, may be formed by any suitable material; however, silicon-on-insulator (SOI) provides a particularly advantageous structure on which a silicon device layer, e.g. 220 nm thick, is provided on a silicon dioxide cladding layer. The waveguide 13 may be provided by any suitable means, e.g. a patterning step to define the waveguide 13, followed by an etching step to form the waveguide 13 into the desired structure. Optical couplers, e.g. grating couplers, may also be patterned and formed in the input section 16 of the waveguide 13 during the aforementioned steps. Alternatively, other forms of optical couplers, e.g. butt couplers, may be provided for coupling light into and out of the photodiode 11. The light absorbing material 14 may be deposited over the composite section of the waveguide 13, e.g. epitaxial growth.

Back reflection in photodetectors, such as the photodiode 11, may be caused by the optical effective index contrast between the waveguide 13 and the light absorbing material 14, which typically has a leading edge perpendicular to the optical axis OA of the input section 16. In order to reduce the back reflection, the present invention introduces an acute angle 19 between a leading edge 18 on the light absorbing material 14 and the optical axis OA of the input section 16 of the waveguide 13 as the input section 16 enters the composite section 17. The angle 19 will result in gradually changing the effective index between the index of the input section 16 and the index of the composite section 17, thereby reducing the amount of light reflecting back to the input section 16. Similarly, the trailing or output edge of the light absorbing material 14 may also be oriented at an acute angle to the optical axis OA of the composite section 17. The trailing edge acute angle may be the same as the leading edge acute angle 19 or different.

Figure 4A:
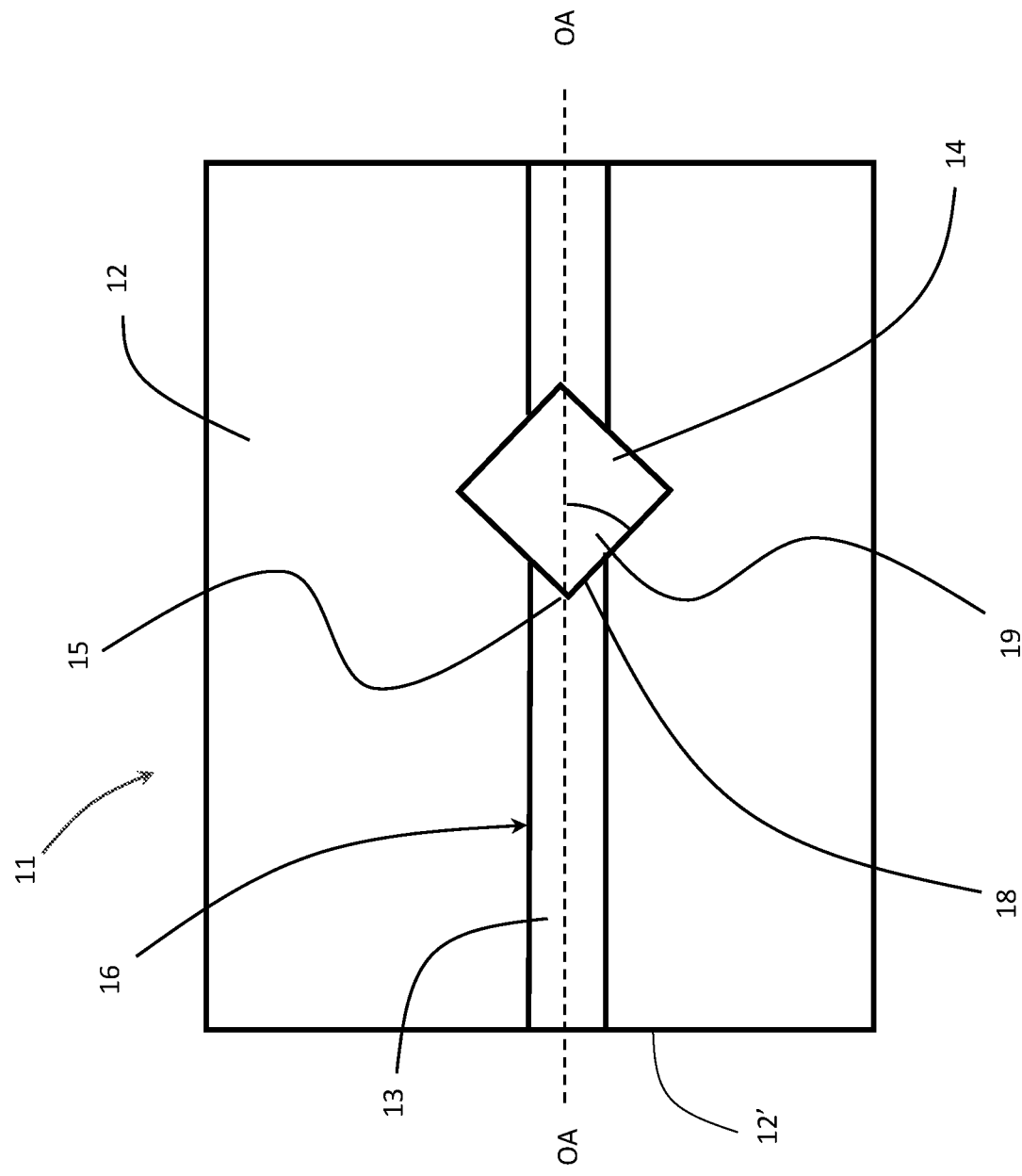
FIG. 4a is a plan view of the device of FIG. 3.
Figure 4B:
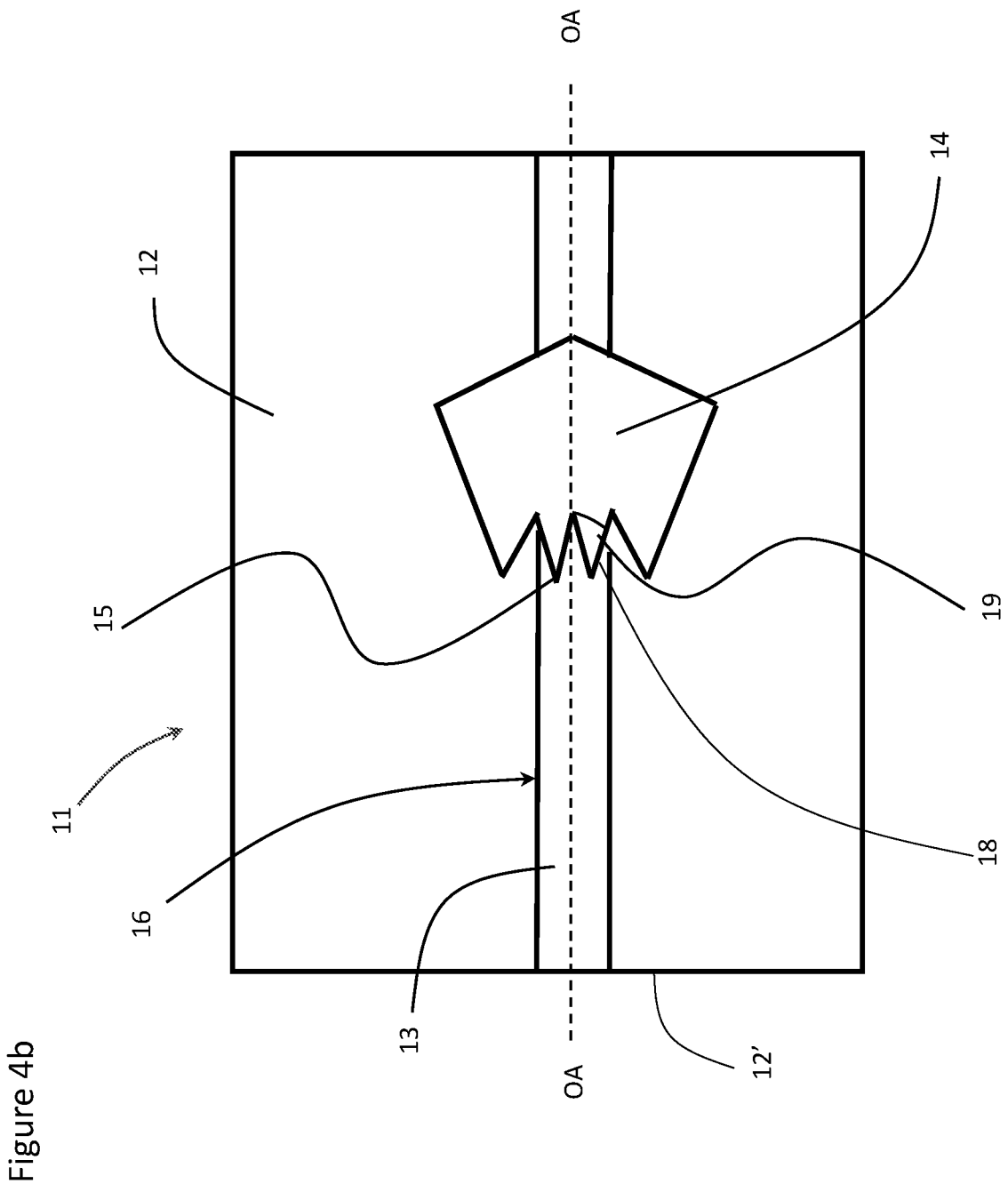
FIG. 4b is a plan view of the device of FIG. 3.

In the embodiment illustrated in FIGS. 3,4a, the light absorbing material 14 may be oriented with a leading edge of the light absorbing material at an acute angle 19 relative to the optical axis OA of the input section 16, whereby an apex 15 of the leading edge 18 is along or adjacent to the optical axis OA. However, any angle 19 is possible, e.g. 10° to 80°, preferably 30° to 60°; however approximately 45° may be ideal. Ideally, the apex 15 may be formed with an edge which is less than the width of the input section 16, e.g. less than 500 nm, preferably less than 250 nm, ideally less than 100 nm, whereby the leading edge 18 includes two portions, one on each side of the optical axis OA, at the acute angle 19 to the optical axis OA. A saw-toothed configuration may also be provided, as illustrated in FIG. 4b in which a plurality of apexes 18' or teeth extend from the body of the light absorbing material 14 over top of the input section 16 of the composite section 17. The teeth 18' may be symmetrical on either side of the optical axis OA, may include one along the optical axis OA, or may be non-symmetrical about the optical OA, depending on the desired application. The teeth 18' may also be periodic or non-periodic, depending on the desired application.

Figure 5:
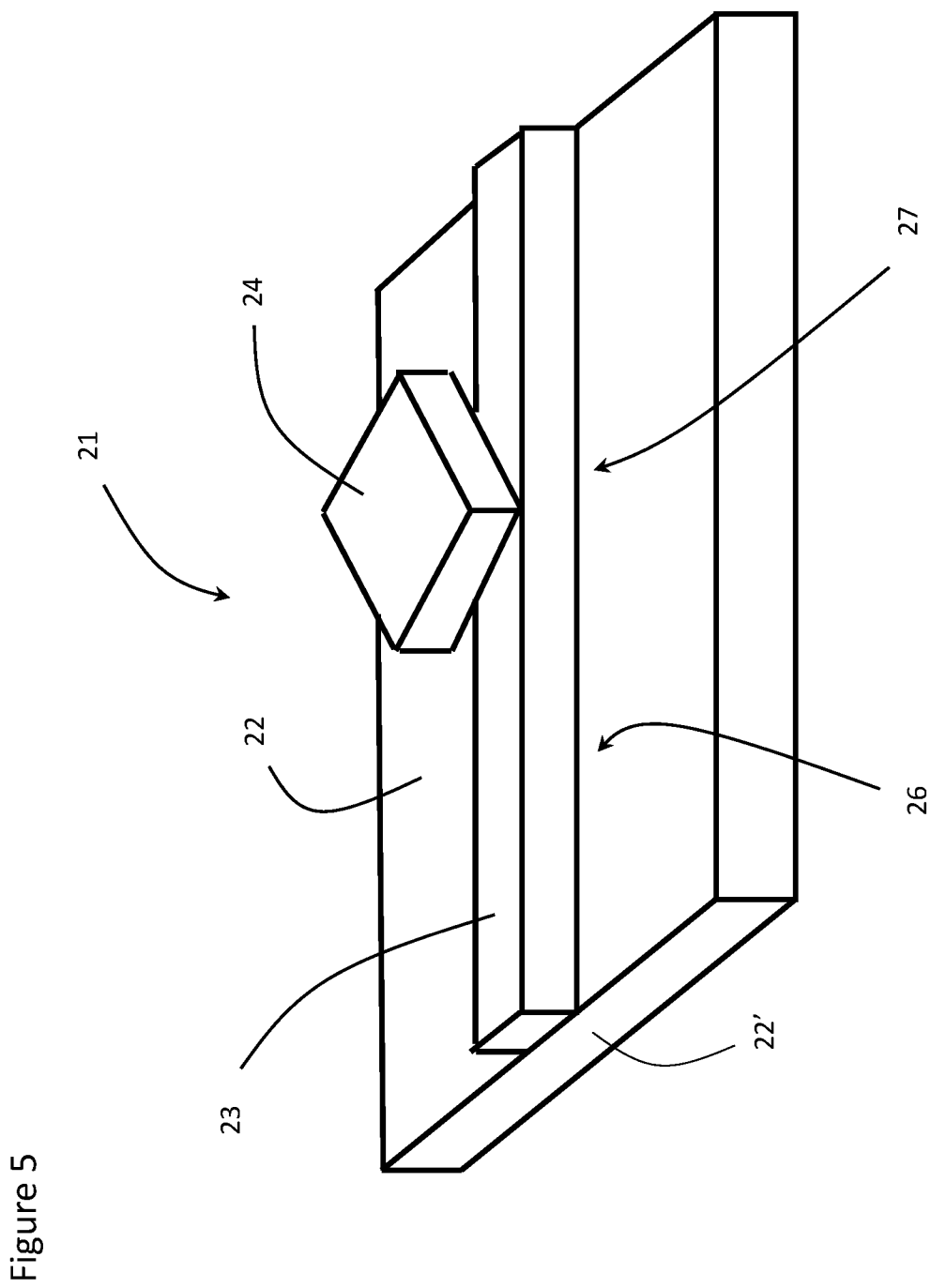
FIG. 5 is an isometric view in accordance with another embodiment of the present invention.
Figure 6:
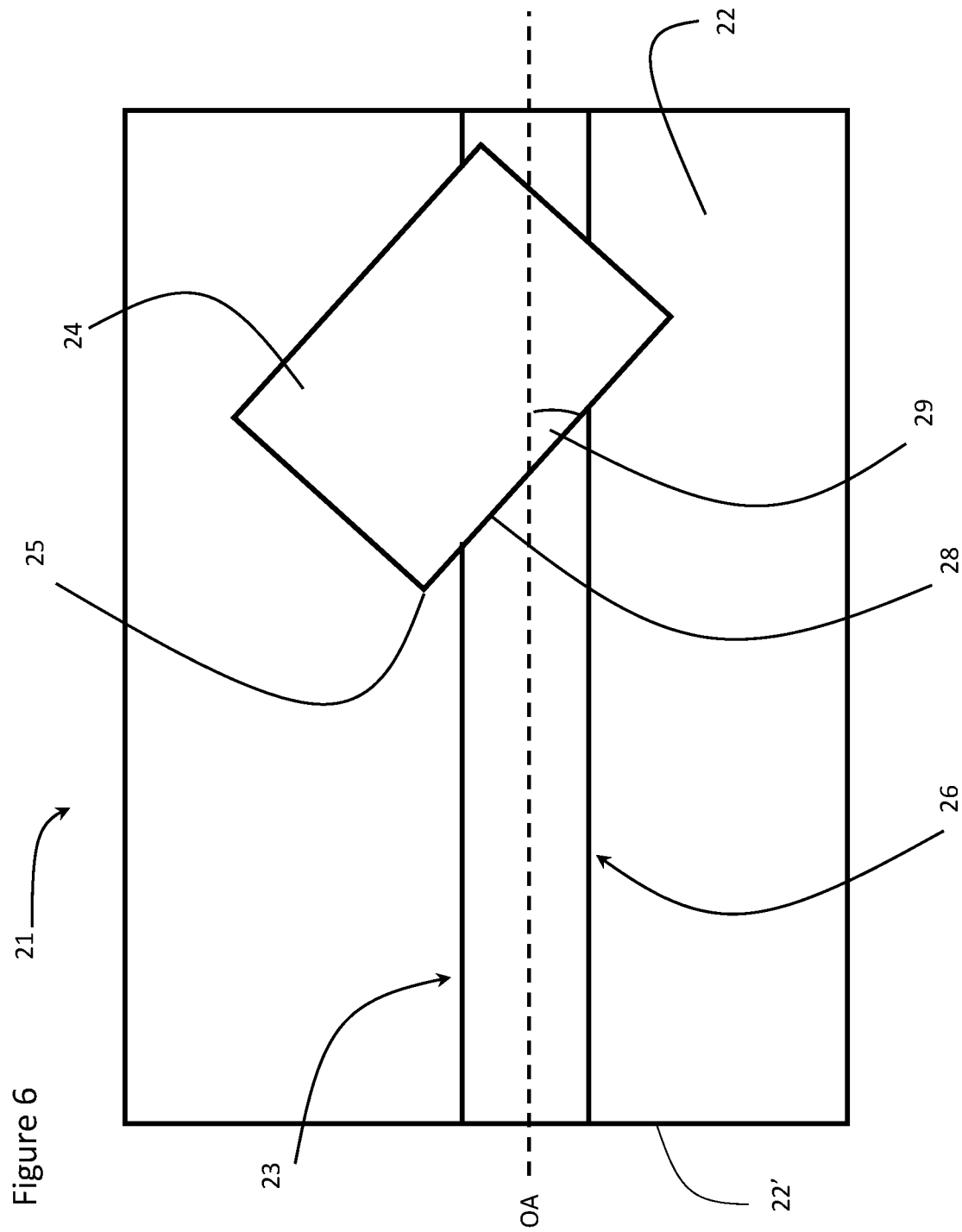
FIG. 6 is a plan view of the device of FIG. 5.

With reference to FIGS. 5 and 6, a photodetector, e.g. photodiode 21, of an exemplary embodiment of the present invention includes a substrate 22, on which is provided a waveguide 23, e.g. silicon, for transmitting an optical signal, typically a single mode optical signal. A cladding material, e.g. $SiO_2$, (not shown) is typically provided surrounding the waveguide 23, with a lower index of refraction than the waveguide material, to contain the optical signal within the waveguide 23. A slab of light absorbing material 24, e.g. germanium, is provided adjacent to the waveguide 23 enabling the optical signal travelling in the waveguide 23 to be absorbed therein. Several semiconductor absorbing materials, e.g. indium gallium arsenide (InGaAs), gallium phosphide (GaP), and Silicon (Si) may be used, but Germanium, which may be epitaxially grown on Silicon, is the preferred absorber material, The light absorbing material 24 is connected to suitable electrical contacts and terminals, as is well known in the art, for transmitting electrical signals generated therein to external components. The waveguide 23 is comprised of an input section 26, and a composite section 27 adjacent to, e.g. beneath, the light absorbing material 24. The input section 26 of the waveguide 23 may extend longitudinally across the substrate 22 with the optical axis OA perpendicular to an input edge 22' of the substrate 22. Ideally, the light absorbing material 24 is epitaxial grown on contact or some other base material, e.g. a doped semiconductor, like Si, or dielectric material, with the crystal orientation of the light absorbing material following that of the contact or base material that is underneath.

The substrate 22, may be formed by any suitable material; however, silicon-on-insulator (SOI) provides a particularly advantageous structure on which a silicon device layer, e.g. 220 nm thick, is provided on a silicon dioxide cladding layer. The waveguide 23 may be provided by any suitable means, e.g. a patterning step to define the waveguide 23, followed by an etching step to form the waveguide 23 into the desired structure. Optical couplers, e.g. grating couplers, may also be patterned and formed in the input section 26 of the waveguide 23 during the aforementioned steps. Alternatively, other forms of optical couplers, e.g. butt couplers, may be provided for coupling light into and out of the photodiode 21. The light absorbing material 24 may be deposited over the composite section of the waveguide 23, e.g. epitaxial growth.

In order to reduce the back reflection, the present embodiment introduces an acute angle 29 between a leading edge 28 on the light absorbing material 24 and the optical axis OA of the input section 26 of the waveguide 23 as the input section 26 enters the composite section 27. The angle 29 will result in gradually changing the effective index between the index of the input section 26 and the index of the composite section 27, thereby reducing the amount of light reflecting back to the input section 26.

In the embodiment illustrated in FIGS. 5 and 6, the light absorbing material 24 may be oriented at any desired acute angle relative to the optical axis OA of the input section 26, whereby an apex 25 of the leading edge 28 is not along the optical axis OA, but outside the width of the waveguide 23, whereby the leading edge 28 includes a single portion, extending across the optical axis OA, at the acute angle 29 to the optical axis OA. Typically, the angle 29 is between 10° and 80°, preferably between 20° and 70°, more preferably 30° and 60°, and even more preferably between 40° and 50°. Similarly, the trailing or output edge of the light absorbing material 24 may also be oriented at an acute angle to the optical axis OA of the composite section 27. The trailing edge acute angle may be the same as the leading edge acute angle 29 or different.

Figure 7:
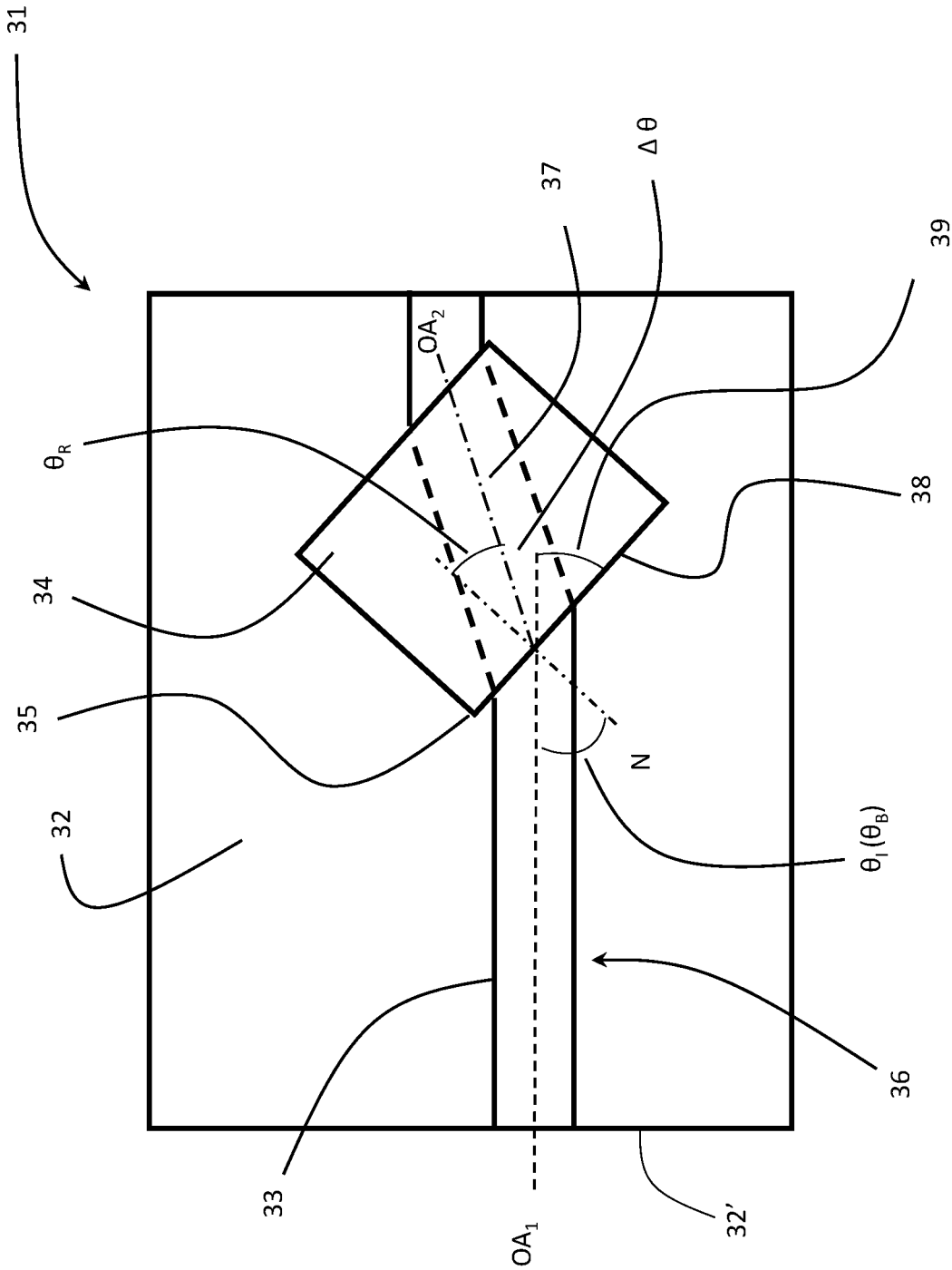
FIG. 7 is a plan view in accordance with another embodiment of the present invention.

In an alternative embodiment illustrated in FIG. 7, a photodetector, e.g. photodiode 31, of an exemplary embodiment of the present invention includes a substrate 32, on which is provided a waveguide 33, e.g. silicon, for transmitting an optical signal, typically a single mode optical signal. A cladding material, e.g. $SiO_2$, (not shown) is typically provided surrounding the waveguide 33, with a lower index of refraction than the waveguide material, to contain the optical signal within the waveguide 33. A slab of light absorbing material 34, e.g. germanium, is provided adjacent to the waveguide 33 enabling the optical signal travelling in the waveguide 33 to be absorbed therein. Several other semiconductor absorbing materials, e.g. indium gallium arsenide (InGaAs), gallium phosphide (GaP) and Silicon (Si) may be used, but Germanium, which may be epitaxially grown on Silicon, is the preferred absorber material 34. The light absorbing material 34 is connected to suitable electrical contacts and terminals, as is well known in the art, for transmitting electrical signals generated therein to external components. The waveguide 33 is comprised of an input section 36, and a composite section 37 adjacent to, e.g. beneath, the light absorbing material 34. The input section 36 of the waveguide 33 may extend longitudinally across the substrate 32 with the optical axis OA perpendicular to an input edge 32' of the substrate 32. Ideally, the light absorbing material 34 is epitaxial grown on contact or some other base material, e.g. a doped semiconductor, like Si, or dielectric material, with the crystal orientation of the light absorbing material following that of the contact or base material that is underneath.

In the embodiment illustrated in FIG. 7, the light absorbing material 34, i.e. the normal N thereto, may be oriented at the Brewster angle ($\theta_B$) relative to the optical axis $OA_1$ of the input section 36, whereby light of a desired polarization will be refracted through the composite section with substantially low or no reflection, and light of the orthogonal polarization will be reflected away from the optical axis $OA_1$, and therefore not back into the waveguide 33. Accordingly, the leading edge 38 may be at the angle 39 of (90°−$\theta_B$) from the optical axis $OA_1$ of the input section 36.

As an example, for a waveguide 33 comprised of silicon with an index ($n_1$=2.1), and composite section 37 comprised of silicon waveguide and a germanium absorbing material 34 with a composite index ($n_2$=2.8) the Brewster angle is tan $\theta_B = n_2/n_1$ or $\theta_B$=49.4°, and the acute angle 39=40.6°. Similarly, the trailing or output edge of the light absorbing material 34 may also be oriented at an acute angle to the optical axis $OA_2$ of the composite section 37. The trailing edge acute angle may be the same as the leading edge acute angle 39 or different.

With reference to all of the aforementioned embodiments, but with specific reference to the example of FIG. 7, due to the change in effective index of refraction, the light will change direction, i.e. refract, when entering the composite section 37. Accordingly, to further improve optical coupling into the light absorbing material 34, the composite section of the waveguide 33, may be angled relative to the input section 36 of the waveguide 33, i.e. the optical axis $OA_1$ of the input section 36 may be angled to the optical axis $OA_2$ of the composite section 37 of the waveguide 33. Solving Snell's law, we get the angel of refraction $\theta_R = \sin^{-1}((n_1 \sin \theta_B)/n_2)$=40.6°, whereby the optical axis $OA_2$ of the composite section 37 of the waveguide 33 may be at an angle $\Delta\theta$ of 49.4°−40.6°=8.8° from the optical axis $OA_1$ of the input section 36.

An apex 35 of the leading edge 38 is not necessarily placed along the optical axis $OA_1$, although it could be, but may be outside the width of the waveguide 33, whereby the leading edge 38 includes a single portion, extending across the optical axis $OA_1$, at the acute angle 39 to the optical axis $OA_1$.

Depending on the growth mechanism. i.e. crystalline orientation of underlying materials, e.g. silicon, and processing of the light absorbing material, it is possible that rotating or orienting the growth window may cause degradation of quality of the light absorbing material and hence degradation of the device performance. Therefore, another embodiment of the present invention is provided that does not rotate the light absorbing material section relative to an input surface of the substrate 32, and instead rotates the input waveguide section running into the light material absorbing section relative to the input surface of the substrate 32. This configuration provides lowered back reflection without compromising the quality of the light absorbing material. Alternative orientations for the waveguide 33 are also possible, such as curved, whereby the optical axis OA is substantially the optical axis as the input section 36 of the waveguide 33 enters the composite section 37

With reference to FIGS. 8 to 11, a photodetector, e.g. photodiode 41, of an exemplary embodiment of the present invention includes a substrate 42, on which is provided a waveguide 43, e.g. silicon, for transmitting an optical signal, typically a single mode optical signal. A cladding material, e.g. $SiO_2$, (not shown) is typically provided surrounding the waveguide 43, with a lower index of refraction than the waveguide material, to contain the optical signal within the waveguide 43. A slab of light absorbing material 44, e.g. germanium, is provided adjacent to the waveguide 43 enabling the optical signal travelling in the waveguide 43 to be absorbed therein. Several other semiconductor absorbing materials, e.g. indium gallium arsenide (InGaAs), gallium phosphide (GaP) and Silicon (Si) may be used, but Germanium, which may be epitaxially grown on Silicon, is the preferred absorber material 44. The light absorbing material 44 is connected to suitable electrical contacts and terminals, as is well known in the art, for transmitting electrical signals generated therein to external components. The waveguide 43 is comprised of an input section 46, and a composite section 47 adjacent to, e.g. beneath, the light absorbing material 44. The input section 46 of the waveguide 43 may extend diagonally across the substrate 42 with the optical axis OA at an acute angle to an input edge 42' of the substrate 42. Ideally, the light absorbing material 44 is epitaxial grown on contact or some other base material, e.g. a doped semiconductor, like Si, or dielectric material, with the crystal orientation of the light absorbing material following that of the contact or base material that is underneath.

The substrate 42, may be formed by any suitable material; however, silicon-on-insulator (SOI) provides a particularly advantageous structure on which a silicon device layer, e.g. 220 nm thick, is provided on a silicon dioxide cladding layer. The waveguide 43 may be provided by any suitable means, e.g. a patterning step to define the waveguide 43, followed by an etching step to form the waveguide 43 into the desired structure. Optical couplers, e.g. grating couplers, may also be patterned and formed in the input section 46 of the waveguide 43 during the aforementioned steps. Alternatively, other forms of optical couplers, e.g. butt couplers, may be provided for coupling light into and out of the photodiode 41. The light absorbing material 44 may be deposited over the composite section of the waveguide 43, e.g. epitaxial growth.

Back reflection in photodetectors, such as the photodiode 41, may be caused by the optical effective index contrast between the waveguide 43 and the light absorbing material 44, which typically has a leading edge perpendicular to the optical axis OA of the input section 46. In order to reduce the back reflection, the present invention introduces an acute angle 49 between a leading edge 48 on the light absorbing material 44 and the optical axis OA of the input section 46 of the waveguide 43. For some fabrication methods, the patterning and etching steps for the waveguide 43 to angle the waveguide 43 across the substrate 42, are easier than growing the light absorbing material 44 at an angle; accordingly, the waveguide 43 is disposed at an angle 49 relative to the light absorbing material 44. The angle 49 will result in gradually changing the effective index between the index of the input section 46 and the index of the composite section 47, thereby reducing the amount of light reflecting back to the input section 46. Similarly, the trailing or output edge of the light absorbing material 44 may also be oriented at an acute angle to the optical axis OA of the composite section 47. The trailing edge acute angle may be the same as the leading edge acute angle 49 or different.

Figure 8:
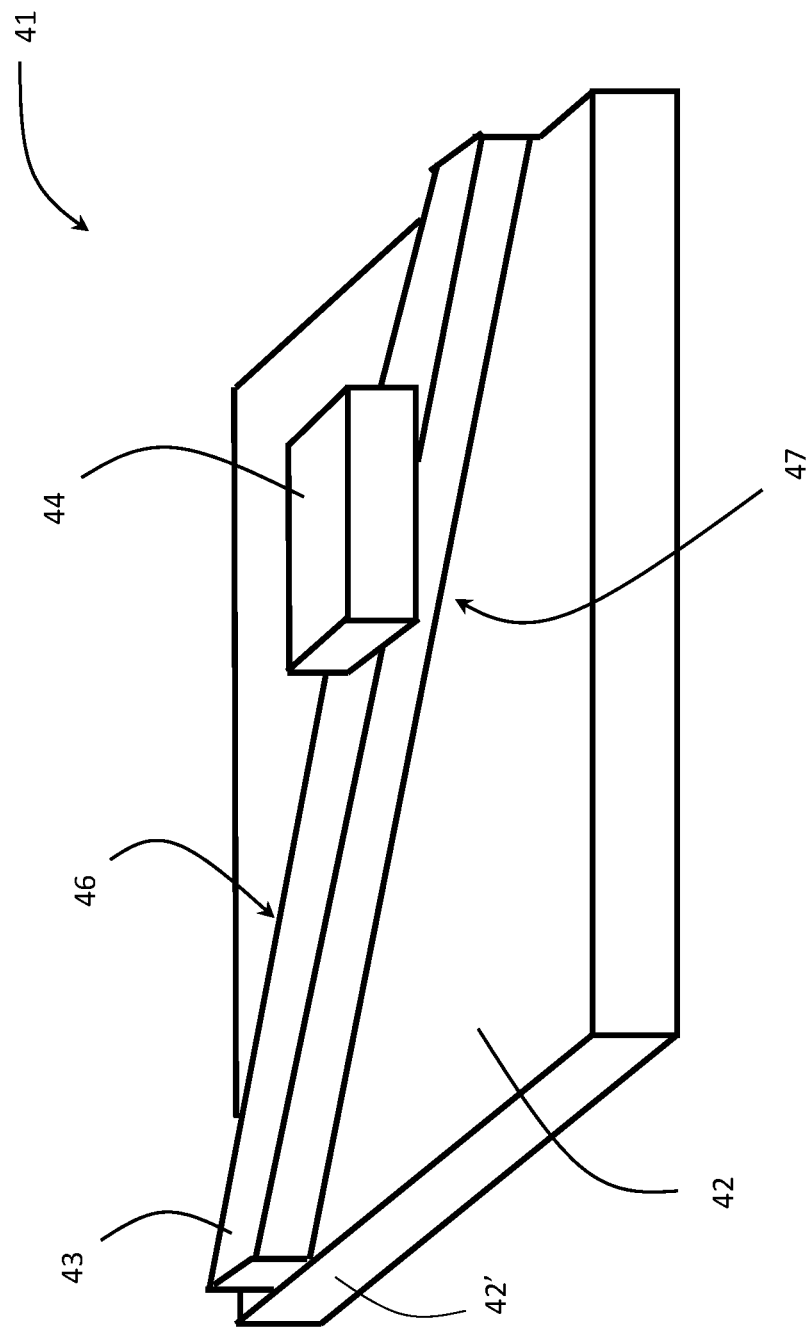
FIG. 8 is an isometric view in accordance with another embodiment of the present invention.
Figure 9:
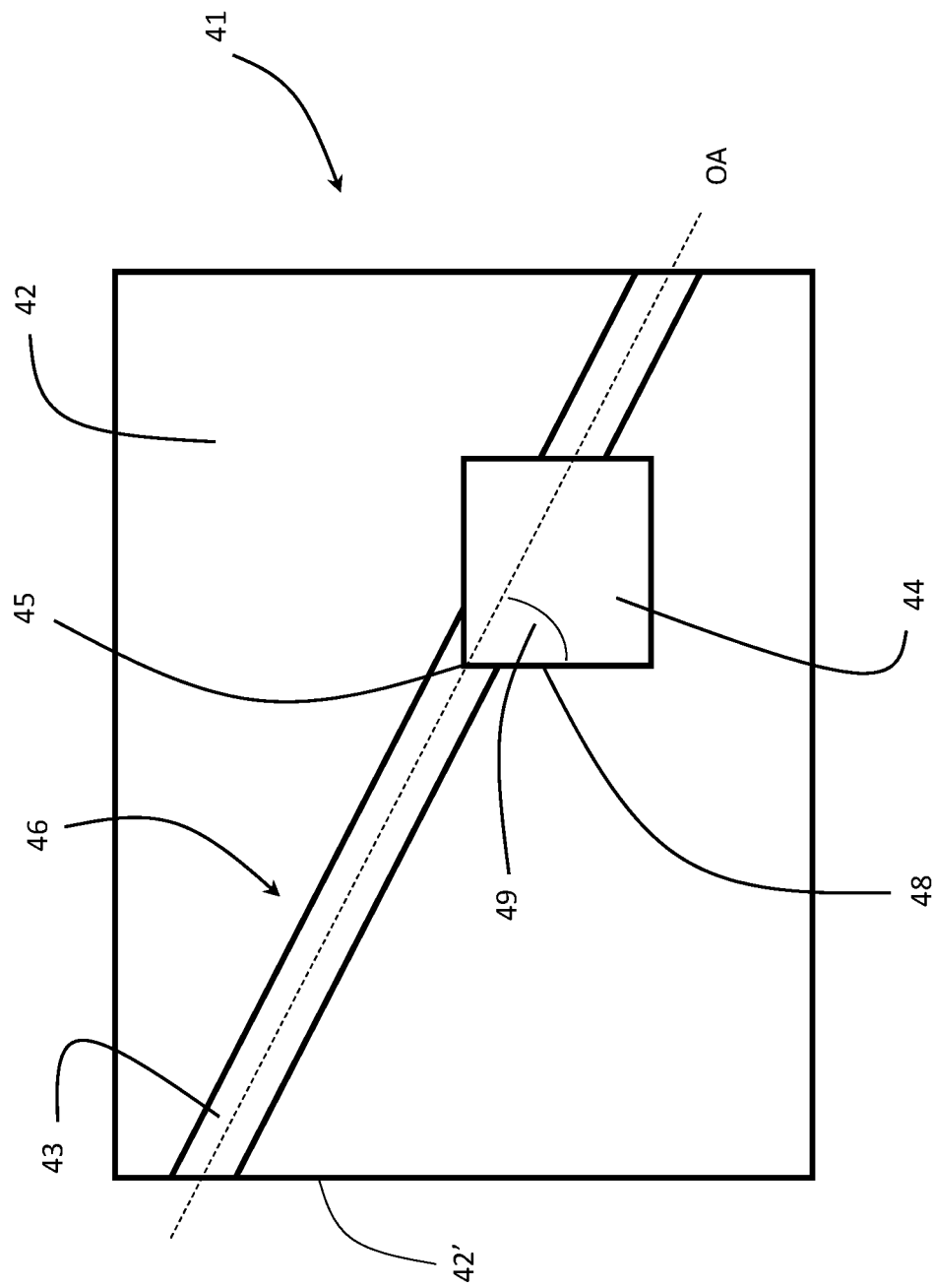
FIG. 9 is a plan view of the device of FIG. 8.

In the embodiment illustrated in FIGS. 8 and 9 a photodiode 41' includes the optical axis OA of the input section 46, which may be rotated by approximately 45°, e.g. 30°-60°, relative to the light absorbing material 44, whereby an apex 45 of the leading edge 48 is along the optical axis OA. Ideally, the apex 45 may be formed with an edge which is less than the width of the input section 46, e.g. less than 500 nm, preferably less than 250 nm, and more preferably less than 100 nm, whereby the leading edge 48 includes two portions, one on each side of the optical axis OA, at the acute angle 49 to the optical axis OA. A saw-toothed configuration may also be provided, as illustrated in FIG. 4b, in which a plurality of apexes 45 or teeth extend from the body of the light absorbing material 44 over top of the input section 46 of the composite section 47. The teeth 45 may be symmetrical on either side of the optical axis OA, may include one along the optical axis OA, or may be non-symmetrical about the optical OA, depending on the desired application. The teeth 45 may be periodic or non-periodic, depending on the desired application.

Figure 10:
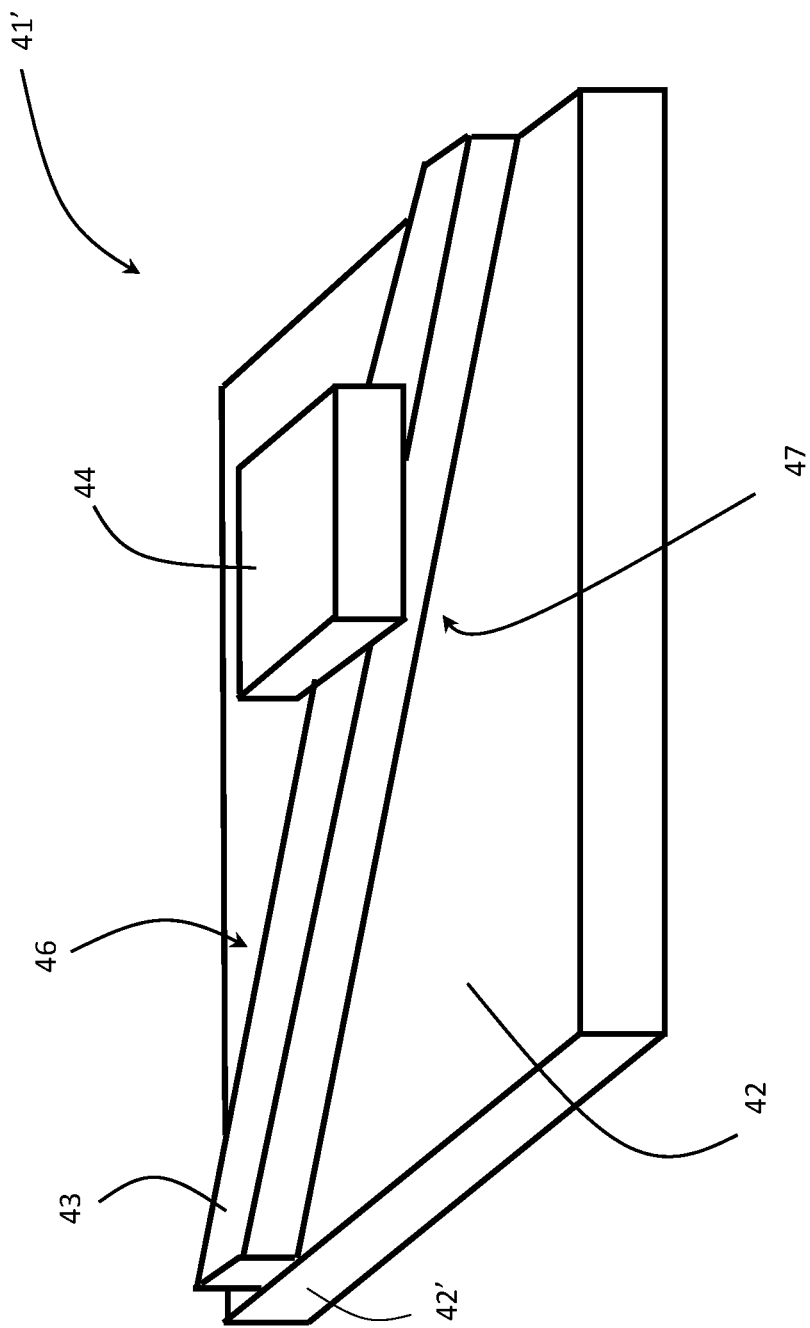
FIG. 10 is an isometric view in accordance with another embodiment of the present invention.
Figure 11:
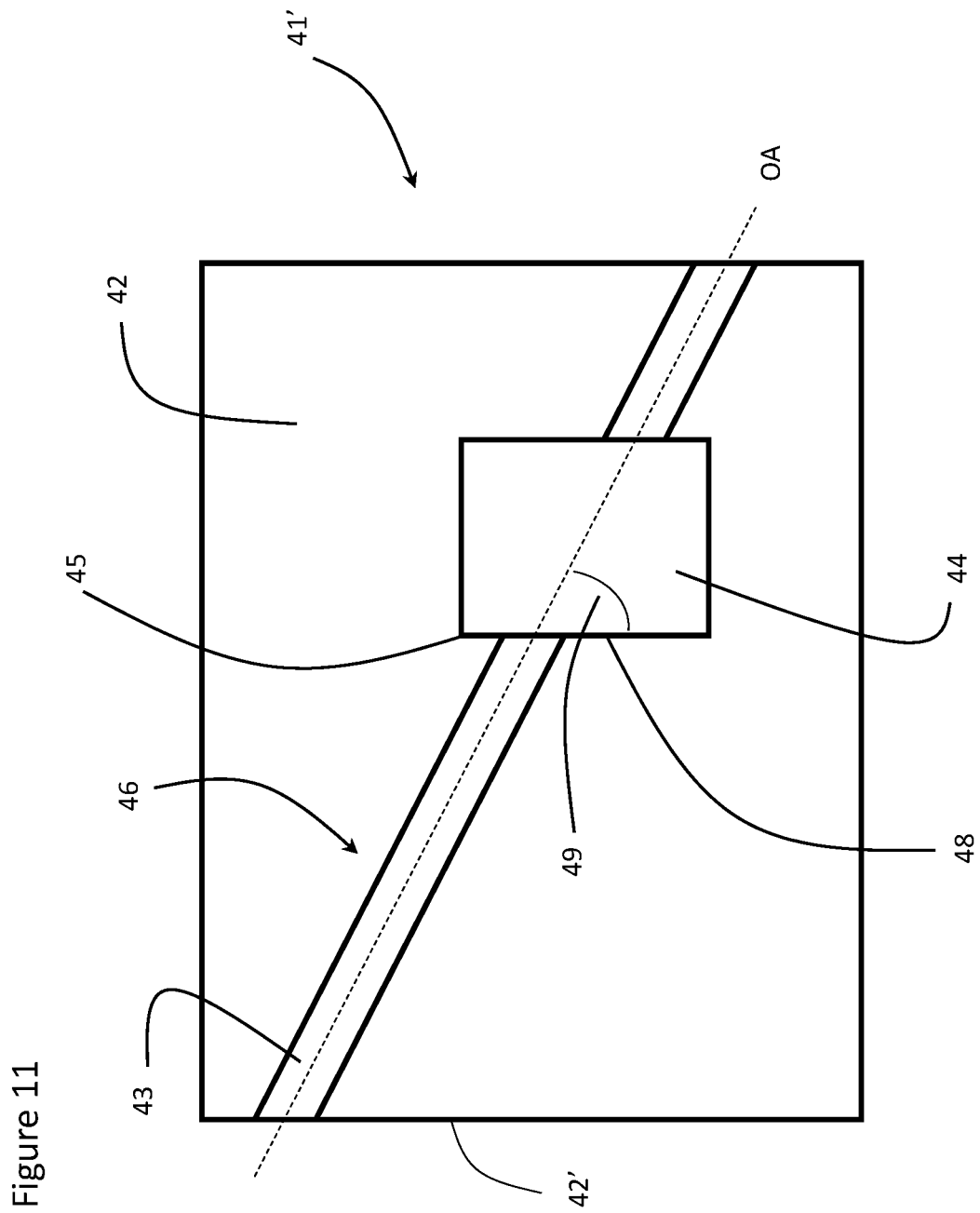
FIG. 11 is a plan view of the device of FIG. 10.

In the embodiment illustrated in FIGS. 10 and 11, the optical axis OA of the input section 46 may be rotated at any desired acute angle relative to the light absorbing material 44, whereby the apex 45 of the leading edge 48 is not along the optical axis OA, but outside the width of the waveguide 43, whereby the leading edge 48 includes a single portion, extending across the optical axis OA, at the acute angle 49 to the optical axis OA, as the input section 46 enters the composite section 47. Typically, the angle 49 is between 10° and 80°, preferably between 20 and 70°, more preferably between 30° and 60°, and even more preferably between 40° and 50°.

Figure 12:
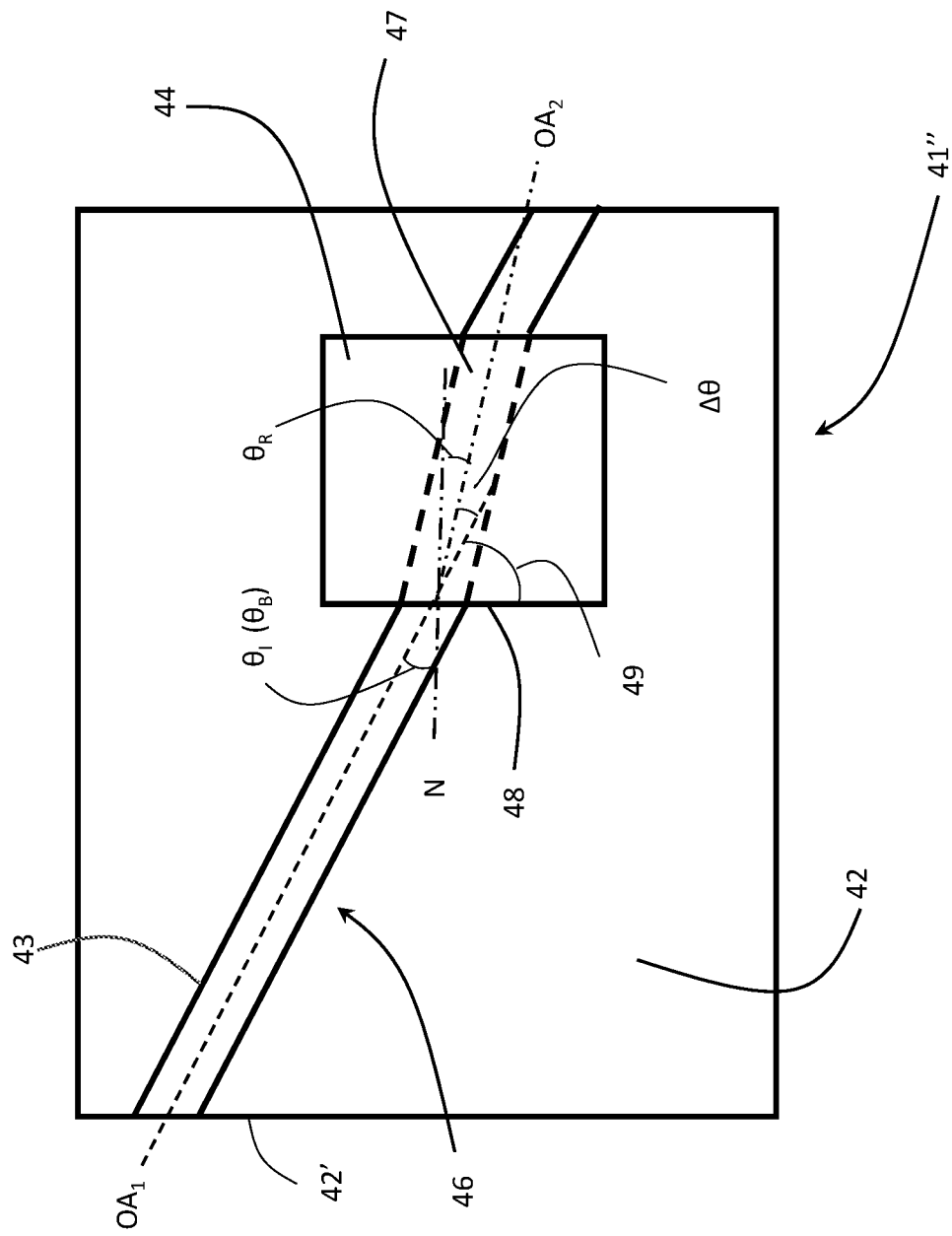
FIG. 12 is a plan view in accordance with another embodiment of the present invention.

In the embodiment illustrated in FIG. 12, a photodiode 41" includes the light absorbing material 44, i.e. the normal N thereto, may be rotated at the Brewster angle ($\theta_B$) relative to the optical axis $OA_1$ of the input section 46, whereby light of a desired polarization will be refracted through the composite section with substantially low or no reflection, and light of the orthogonal polarization will be reflected away from the optical axis $OA_1$ and therefore not back into the input waveguide section 46. Accordingly, the leading edge 48 may be at the angle 49 of (90°−$\theta_B$) from the optical axis $OA_1$ of the input section 46.

As an example, for a waveguide 43 comprised of silicon with an index ($n_1$=2.1), and composite section 37 comprised of silicon waveguide and a germanium absorbing material 34 with a composite index ($n_2$=2.8) the Brewster angle is tan $\theta_B$=$n_2/n_1$ or $\theta_B$=49.4°, and the acute angle 39=40.6°.

Due to the change in effective index of refraction, the light will change direction, i.e. refract, when entering the composite section 47. Accordingly, to further improve optical coupling into the light absorbing material 44, the composite section of the waveguide 43, may be angled relative to the input section 46 of the waveguide 43, i.e. the optical axis $OA_1$ of the input section 46 may be angled to the optical axis $OA_2$ of the composite section 47 of the waveguide 43. For Example: solving Snell's law, we get the angel of refraction $\theta R$=$\sin^1$ (($n_1$ sin $\theta_B$)/$n_2$)=40.6°, whereby the optical axis $OA_2$ of the composite section 47 of the waveguide 43 may be at an angle $\Delta\theta$ of 49.4°−40.6°=8.8° from the optical axis $OA_1$ of the input section 46.

An apex 45 of the leading edge 48 is not necessarily placed along the optical axis $OA_1$, although it could be, but may be outside the width of the waveguide 43, whereby the leading edge 48 includes a single portion, extending across the optical axis $OA_1$, at the acute angle 49 to the optical axis $OA_1$ as the input section 46 enters the composite section 47.

With reference to FIGS. 13A to 13F, an exemplary method of fabricating a light absorbing, e.g. germanium, detector 11, 21, 31 or 41 may be executed using a process to create conventional p-i-n detectors with 0.5 μm thick light absorbing material slab 14, 24, 34 or 44, and no additional process split thanks to the anisotropic epitaxial growth of the light absorbing material 14, 24, 34 or 44. The substrate 12, 22, 32 or 42 may start with an 8-inch silicon on insulator (SOT) wafer 52, with 220 nm, 10 ohm-cm p-type top silicon film 53, and 2 μm buried oxide layer 54 on top of a high resistivity silicon handle 55. FIGS. 13B and 13C illustrate the steps of patterning the top layer 53 by lithography and etching to create the waveguide 13, 23, 33 or 43, including the input section 16, 26, 36 or 46 (FIG. 13B) and the composite section 17, 27, 37 or 47 (FIG. 13C). The waveguides 13, 23, 33 and 43 may be sized suitable for transmitting single mode optical signals, e.g. 500 nm wide, but other sizes and shapes are possible. The waveguide 13, 23, 33 or 43, including the input section 16, 26, 36 or 46 and the composite section 17, 27, 37 or 47, may be patterned using 248 nm UV lithography followed by dry etching. With reference to FIG. 13C, the patterning and etching steps may also include forming contact regions 61 and 62 on either side of the composite section 17, 27, 37 or 47; however, other forms of contacts may be provided. The input section 16, 26 or 36 may extend directly across the substrate 12, 22 or 32, with the optical axis OA perpendicular to an input edge of the substrate 12, 22 or 32, as illustrated in FIGS. 2 to 7 or diagonally across the substrate 42, with the optical axis OA at an acute angle to an input edge of the substrate 42, as illustrated in FIGS. 8 to 12.

FIG. 13D illustrates the steps involved in doping the regions adjacent the composite section 17, 27, 37 or 47 by implantation, e.g. boron and phosphorus ions, and annealing, e.g. rapid thermal annealing, to form a p-type contact 61 and an n-type contact 62. Ideally, the p-contact 61 is comprised of two or three sections with distinct or gradually increasing amounts of doping, i.e. decreasing resistance, moving away from the composite section 17, 27, 37 or 47. In the illustrated embodiment, the contact 61 includes a first section 71 with a first amount of doping p underneath the light absorbing material 14, 24, 34 or 44, a second intermediate p+ doped slab 72 connected to the first section 71, and a third highest p++ doped section 73 underneath a terminal the metal via. The n contact 62 comprises similar section sections with similar doping levels. The sheet resistance at the intermediate doping level p+ may be between approximately 3500 Ω/sq (Ohms per square) and 1500 Ω/sq for p+ and n+ silicon slab 72, respectively. The second section 72 may be 1.5 μm wide and 16 μm long, leading to around 500 series resistance.

Since the light is tightly confined in the light absorbing material 14, 24, 34 or 44, it is safe to use higher doping on the connecting slabs without introducing noticeable optical loss from free carrier absorption. The sheet resistance for the p++ and n++ dope section 73 may be between approximately 140 Ω/sq and 60 Ω/sq which is more than an order of magnitude, e.g. $1/25^{th}$, smaller than those of the second p+ and n+ slab 72, and will totally remove RC time limit on device operating bandwidth.

FIG. 13E illustrates the step of depositing and planarizing a layer of cladding 82, such as an oxide, e.g. silicon oxide, on top of the contacts 61 and 62, and the waveguide 43. A window 83 is then etched from the cladding layer 82 at an angle to the input waveguide section 46 over top of the inner first sections 71 of the contacts 61 and 62 and the composite waveguide section 47 of the waveguide 43.

FIG. 13F illustrates the step of performing epitaxy for the light absorbing material 14, 24, 34 or 44 in the window 83. The crystal orientation of the light absorbing material follows that of the underlying material, i.e. contacts 61 and 62 and composite waveguide section 47 of the waveguide 43. Ideally, the light absorbing material 14, 24, 34 or 44 extends across the composite section 17, 27, 37 or 47, and over top of the first sections 71 of the p and n contacts 61 and 62. In embodiments, the window 83 is etched and the light absorbing material 14, 24 and 34 is deposited at an angle to the waveguide 12, 22 and 32. In an alternate embodiments, the window 83 is etched and the light absorbing material 44 is deposited straight relative to an angled waveguide 42. In an embodiment, the light absorbing material may comprise a semiconductor, e.g. germanium, and in a preferred embodiment the light absorbing material may comprise an intrinsic semiconductor, e.g. intrinsic germanium, body; however, other semiconductor light absorbing materials, e.g. indium gallium arsenide (InGaAs), gallium phosphide (GaP) and silicon (Si) may be used. The light absorbing material 14, 24, 34 or 44 may comprise a variety of shapes, including a rectangular or a triangular cross section. The fabrication of the light absorbing material 14, 24, 34 or 44 may be executed using chemical vapor deposition (CVD), including both plasma enhanced (PE) CVD and ultra-high vacuum (UHV) CVD. In general, an intrinsic semiconductor, also called an undoped semiconductor i-type semiconductor, is a pure semiconductor without any significant dopant species present. The number of charge carriers is therefore determined by the properties of the material itself instead of the amount of impurities. In particular, an intrinsic semiconductor, such as intrinsic germanium, is generally understood to have few or no deliberately added dopants, although it is understood that some amount of dopants or impurities may well be present. Although, the light absorbing material 14, 24, 34 or 44 is typically illustrated in rectangular form, the light absorbing material 14, 24, 34 or 44 may be deposited in any shape.

FIG. 13G illustrates the steps of applying metallization to provide contact terminals 81. As needed, vias, e.g. comprising aluminum, may be defined in layers of the structure to allow the contact terminals 81 to extend from the third sections 73 of the contacts 61 and 62 so as to be accessible at a free surface of the completed structure. Additional planarization and/or cladding layer 82 may be provided overtop of the light absorbing material 14, 24, 34 or 44 and the waveguide 12, 22, 32 or 42. Some steps need to be performed in a specific sequence, and some steps might be performed in alternative sequences (or in any order). For example, boron and phosphorus ion implantation may be done in either order, and the contacts 61 and 62 may be formed after the light absorbing material 14, 24, 34 or 44.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A photodetector device comprising:
a substrate;
a waveguide extending on the substrate for transmitting an optical signal, the waveguide including an input section including a first optical axis, and a composite section including a second optical axis; and
a light-absorber material for generating electrical signals by absorbing the optical signal, the light-absorber material disposed adjacent to the composite section of the waveguide resulting in an effective index of refraction between an index of the waveguide and an index of the composite section;
wherein at least one of a leading edge of the light-absorber material or a trailing edge of the light-absorber material is configured to provide a gradual change in the effective index of refraction, thereby reducing back reflection.

2. The device according to claim 1, wherein the leading edge of the light absorber material is at a first acute angle to the first optical axis.

3. The device according to claim 2, wherein the first acute angle is between 30° and 60°.

4. The device according to claim 2, wherein a normal to the leading edge of the light absorber material is oriented at a Brewster's angle relative to the first optical axis of the input section.

5. The device according to claim 1, wherein the leading edge of the light-absorber material includes an apex disposed along or adjacent the first optical axis; and wherein a width of the apex is smaller than a width of the waveguide.

6. The device according to claim 5, wherein the apex is less than 100 nm wide.

7. The device according to claim 1, wherein the leading edge of the light-absorbing material includes a plurality of teeth, each with an apex disposed along or adjacent the first optical axis.

8. The device according to claim 2, wherein the composite section includes a second optical axis at a second acute angle relative to the first optical axis of the input section.

9. The device according to claim 8, wherein the second acute angle is based on a difference between the first acute angle and an angle of refraction of the optical signal entering the composite section.

10. The device according to claim 1, wherein the trailing edge of the light absorber material is at a third acute angle to the second optical axis of the composite section.

11. The device according to claim 1, wherein the first optical axis of the input section extends diagonally across the substrate with the first optical axis at an acute angle to an input edge of the substrate.

\* \* \* \* \*